US008265283B2

(12) United States Patent
Iwamatsu

(10) Patent No.: US 8,265,283 B2
(45) Date of Patent: Sep. 11, 2012

(54) ACOUSTIC PROCESSING DEVICE AND ACOUSTIC PROCESSING METHOD

(75) Inventor: Masayuki Iwamatsu, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 813 days.

(21) Appl. No.: 12/324,720

(22) Filed: Nov. 26, 2008

(65) Prior Publication Data

US 2009/0141911 A1 Jun. 4, 2009

(30) Foreign Application Priority Data

Nov. 30, 2007 (JP) ................................ 2007-310764

(51) Int. Cl.
*H03F 99/00* (2009.01)

(52) U.S. Cl. ................ 381/17; 381/63; 381/61; 381/27; 381/303; 381/307; 381/18; 381/1; 381/309; 381/310

(58) Field of Classification Search .................... 381/63, 381/61, 27, 303, 307, 17, 18, 1, 309, 310
See application file for complete search history.

(56) References Cited

U.S. PATENT DOCUMENTS

| | | | |
|---|---|---|---|
| 4,980,914 A * | 12/1990 | Kunugi et al. | 381/1 |
| 5,444,785 A | 8/1995 | Izawa et al. | |
| 5,524,053 A | 6/1996 | Iwamatsu | |
| 5,572,591 A | 11/1996 | Numazu et al. | |
| 5,727,067 A | 3/1998 | Iwamatsu | |
| 6,888,058 B2 | 5/2005 | Urai et al. | |
| 2003/0126975 A1 | 7/2003 | Urai et al. | |

FOREIGN PATENT DOCUMENTS

| | | |
|---|---|---|
| JP | 04-186296 A | 7/1992 |
| JP | 05-027800 U | 4/1993 |
| JP | 05-265478 A | 10/1993 |
| JP | 06-022400 A | 1/1994 |
| JP | 06-261396 A | 9/1994 |
| JP | 06-261398 | 9/1994 |

(Continued)

OTHER PUBLICATIONS

Notification of Reasons for Refusal, mailed Jun. 26, 2012, for JP Patent Application No. 2007-310764, with English Translation, 11 pages.

*Primary Examiner* — Tom Thomas
*Assistant Examiner* — Benjamin Tzu-Hung Liu
(74) *Attorney, Agent, or Firm* — Morrison & Foerster LLP

(57) ABSTRACT

An acoustic processing device, includes an inputting section which receives a first audio signal and a second audio signal, a first input signal amplifying section which amplifies the first audio signal at an amplification factor, a second input signal amplifying section which amplifies the second audio signal at an amplification factor, a first initial delayed amplifying section, a first adding section which adds the first audio signal amplified by the first amplifying portion and the first audio signal amplified by the first input signal amplifying section, a second adding section which adds the first audio signal amplified by the second amplifying portion and the second audio signal amplified by the second input signal amplifying section, a first supplying section which supplies an audio signal output from the first adding section to a first sound emitting section, and a second supplying section which supplies an audio signal output from the second adding section to a second sound emitting section different from the first sound emitting section.

11 Claims, 7 Drawing Sheets

FOREIGN PATENT DOCUMENTS

| | | | |
|---|---|---|---|
| JP | 07-181988 | A | 7/1995 |
| JP | 09-065500 | A | 3/1997 |
| JP | 11-187497 | A | 7/1999 |
| JP | 2000-069599 | A | 3/2000 |
| JP | 2000-078700 | A | 3/2000 |
| JP | 2000-099066 | A | 4/2000 |
| JP | 2002-034100 | A | 1/2002 |
| JP | 2003-208158 | A | 7/2003 |

* cited by examiner

ACOUSTIC PROCESSING DEVICE AND ACOUSTIC PROCESSING METHOD

BACKGROUND

The present invention relates to the technology to emphasize a sound image by an acoustic processing of an audio signal.

In playing the music, it is requested that various sound field effects should be attached by applying the acoustic processing to the audio signals to be emitted as the sounds. As an example in attaching such sound field effect, four speakers are provided in front left, front right, rear left, and rear right sides of the listener, and the acoustic processing is applied to the audio signals emitted from respective speakers and the sounds are emitted, so that reflected sound in various directions are reproduced. Also, only two speakers are provided in front left and front right sides, the technology to attach the similar sound field effect is disclosed (for example, Patent Literature 1).

[Patent Literature 1] JP-A-6-261398

According to the technology set forth in Patent Literature 1, various sound field effects can be attached by two speakers provided in front left and front right sides of the listener. In this case, even when the audio signals are the stereo signals, the sound field effect is attached by executing the acoustic processing after the stereo signals are converted into the monaural signal that is obtained by synthesizing the right-channel signal and the left-channel signal. Therefore, a stereo feeling is lost in reproducing the initial reflected sound, and also sometimes an emphasizing effect of the sound source and a stereophonic effect are lost.

SUMMARY

The present invention has been made in view of the above circumstances and it is an object of the present invention to provide an acoustic processing device and an acoustic processing method capable of generating an initial reflected sound that can emphasize a sound image by attaching an emphasizing effect of a sound source while keeping a stereo feeling.

In order to solve the above problem, the present invention provides an acoustic processing device, comprising:

an inputting section which receives a first audio signal and a second audio signal;

a first input signal amplifying section which amplifies the first audio signal at a predetermined amplification factor;

a second input signal amplifying section which amplifies the second audio signal at a predetermined amplification factor;

a first initial delayed amplifying section having:

- a delay portion for delaying the first audio signal to give a predetermined delay time;
- a first amplifying portion for amplifying the delayed first audio signal at a first amplification factor; and
- a second amplifying portion for amplifying the delayed first audio signal at a second amplification factor;

a first adding section which adds the first audio signal amplified by the first amplifying portion and the first audio signal amplified by the first input signal amplifying section;

a second adding section which adds the first audio signal amplified by the second amplifying portion and the second audio signal amplified by the second input signal amplifying section;

a first supplying section which supplies an audio signal output from the first adding section to a first sound emitting section; and a second supplying section which supplies an audio signal output from the second adding section to a second sound emitting section being different from the first sound emitting section.

Preferably, a plurality of the first initial delayed amplifying sections are provided. The predetermined delay times given by a plurality of the delay portions of the first initial delayed amplifying sections are different to each other.

Preferably, a plurality of the first initial delayed amplifying sections are provided. A ratio between the first amplification factor of the first amplifying portion and the second amplification factor of the second amplifying portion of one of the first initial delayed amplifying sections is different from that of the other of the first initial delayed amplifying sections.

Preferably, the acoustic processing device further includes a second initial delayed amplifying section. The second initial delayed amplifying section has a delay portion for delaying the second audio signal being input from the inputting section to give a predetermined delay time, a first amplifying portion for amplifying the delayed second audio signal at a first amplification factor, and a second amplifying portion for amplifying the delayed second audio signal at a second amplification factor. The first adding section adds the first audio signal amplified by the first amplifying portion of the first initial delayed amplifying section, the first audio signal amplified by the first input signal amplifying section, and the second audio signal amplified by the first amplifying portion of the second initial delayed amplifying section. The second adding section adds the first audio signal amplified by the second amplified portion of the first initial delayed amplifying section, the second audio signal amplified by the second input signal amplifying section, and the second audio signal amplified by the second amplifying portion of the second initial delayed amplifying section.

Here, it is preferable that the delay times set in the first initial delayed amplifying section and the second initial delayed amplifying section are 60 millisecond or less respectively.

Preferably, the acoustic processing device further includes a synthesizing section which adds the first audio signal and the second audio signal to output an added signal as a synthesized audio signal, and a space reflected sound generating section which includes a first space delayed amplifying section which has a delay portion for delaying the synthesized audio signal output from the synthesizing section to give a predetermined delay time and an amplifying portion for amplifying the delayed synthesized audio signal at a predetermined amplification factor to output a first amplified signal to the first supplying section, and a second space delayed amplifying section which has a delay portion for delaying the synthesized audio signal output from the synthesizing section to give a predetermined delay time and an amplifying portion for amplifying the delayed synthesized audio signal at a predetermined amplification factor to output a second amplified signal to the second supplying section.

Here, it is preferable that the delay times set in the first space delayed amplifying section and the second space delayed amplifying section are longer than the delay time set in the first initial delayed amplifying section.

Here, it is preferable that the acoustic processing device further includes a cross talk canceling section. The cross talk canceling section includes a first phase adjusting portion which adjusts a phase of a third audio signal, a second phase adjusting portion which adjusts a phase of a fourth audio signal, a first adding portion which adds the adjusted fourth audio signal and the third audio signal to output a first added signal to the first supplying section, and a second adding portion which adds the adjusted third audio signal and the fourth audio signal to output a second added signal to the second supplying section. The space reflected sound generating section further includes a third space delayed amplifying section which has a delay portion for delaying the synthesized audio signal output from the synthesizing section to give a predetermined delay time and an amplifying portion for amplifying the delayed synthesized audio signal at a predetermined amplification factor to output the third amplified signal, and a fourth space delayed amplifying section which has a delay portion for delaying the synthesized audio signal output from the synthesizing section to give a predetermined delay time and an amplifying portion for amplifying the delayed synthesized audio signal at a predetermined amplification factor to output the fourth amplified signal.

Here, it is preferable that the acoustic processing device further includes a second inputting section which receives a monaural audio signal. The synthesizing section further adds the monaural audio signal to the first audio signal and the second audio signal to output the added signal.

Preferable, the acoustic processing device further includes a dynamic range controlling section which receives the audio signal that is added in the first supplying section and the audio signal that is added in the second supplying section to corrects dynamic ranges of respective input audio signals. The dynamic range controlling section supplies the corrected audio signals to the first and second sound emitting sections.

Here, it is preferable that the acoustic processing device further includes a correcting section which corrects the first amplification factor and the second amplification factor set in the first initial delayed amplifying section, based on a correction of the dynamic range by the dynamic range controlling section.

According to the present invention, there is also provided an acoustic processing method, comprising:

receiving a first audio signal and a second audio signal;

amplifying the first audio signal at a predetermined amplification factor;

amplifying the second audio signal at a predetermined amplification factor;

delaying the first audio signal to give a predetermined delay time;

amplifying the delayed first audio signal at a first amplification factor;

amplifying the delayed first audio signal at a second amplification factor;

adding the first audio signal amplified by the first amplification factor and the first audio signal amplified by the predetermined amplification factor to output a third audio signal;

adding the first audio signal amplified by the second amplification factor and the second audio signal amplified by the predetermined amplification factor to output a fourth audio signal;

supplying the third audio signal to a first sound emitting section; and supplying the fourth audio signal to a second sound emitting section which is different from the first sound emitting section.

According to the present invention, the acoustic processing device and the acoustic processing method, which is capable of generating the initial reflected sound that can emphasize the sound image by attaching the emphasizing effect of the sound source while keeping the stereo feeling can be provided.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

An embodiment of the present invention will be explained hereinafter.

<Embodiment>

Figure 1:
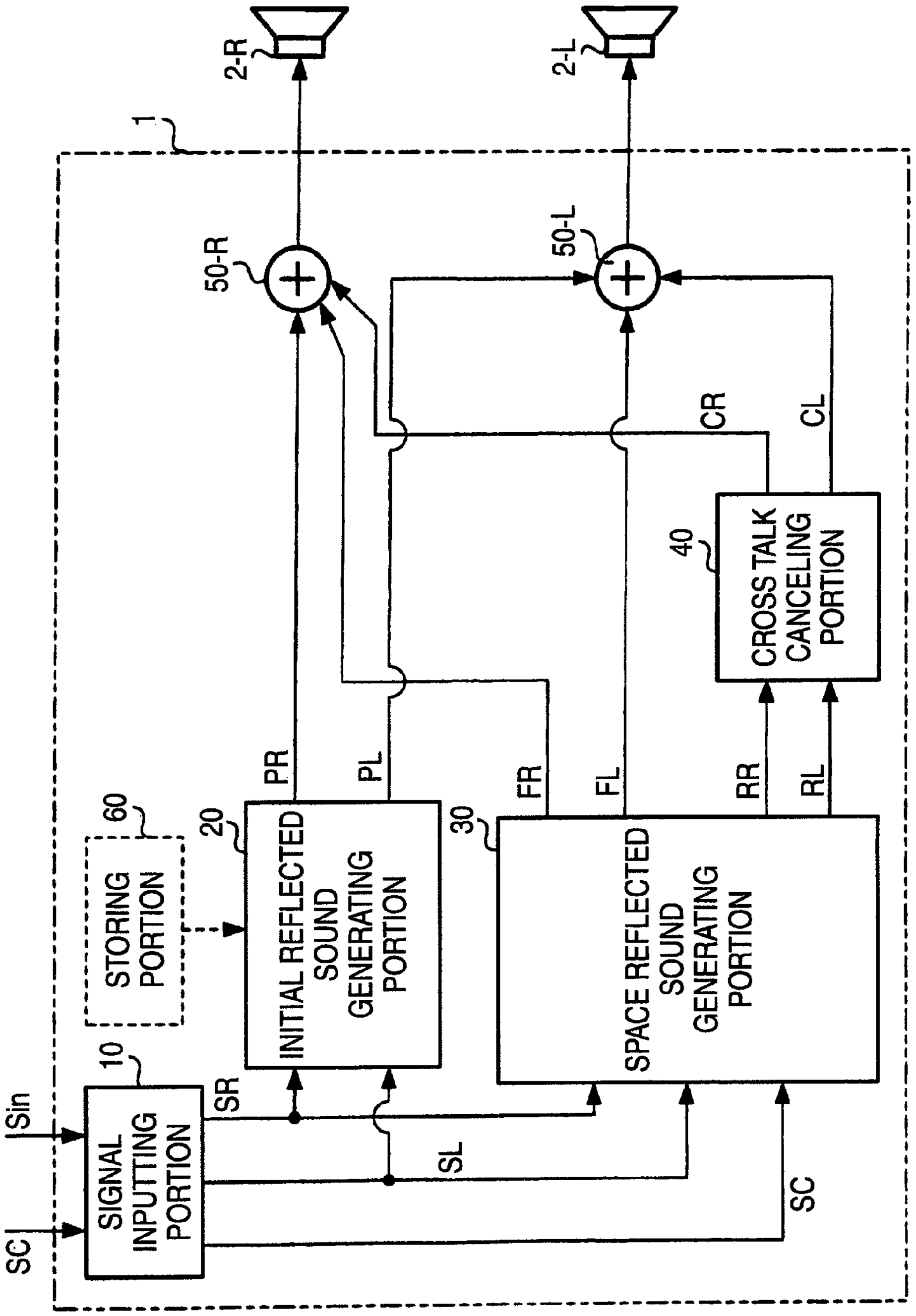
FIG. 1 is a block diagram showing a configuration of an acoustic processing device according to an embodiment of the present invention.

An acoustic processing device 1 according to an embodiment of the present invention applies a predetermined acoustic process to an input audio signal, and then supplies the signal to speakers connected externally. The acoustic processing device 1 will be explained with reference to FIG. 1. FIG. 1 is a block diagram showing a configuration of the acoustic processing device 1. Here, the speakers connected externally are a speaker 2-R for a right channel, and a speaker 2-L for a left channel.

Audio signals Sin, SC are input into a signal inputting portion 10 from the outside. The audio signal Sin is a stereo signal on 2 channels. The audio signal on a right channel is called an audio signal SR (first audio signal), and the audio signal on a left channel is called an audio signal SL (second audio signal). Also, the audio signal SC (monaural audio signal) is a one-channel monaural signal, and is the audio signal generated based on the sound caught by a microphone, or the like, for example.

The signal inputting portion 10 outputs audio signals SR, SL, which are given by putting the input audio signal Sin into respective channels, to an initial reflected sound generating portion 20 and a space reflected sound generating portion 30. Also, the signal inputting portion 10 outputs the input audio signal SC to the space reflected sound generating portion 30. In this case, the audio signal SC may not be always input into the signal inputting portion 10.

Figure 2:
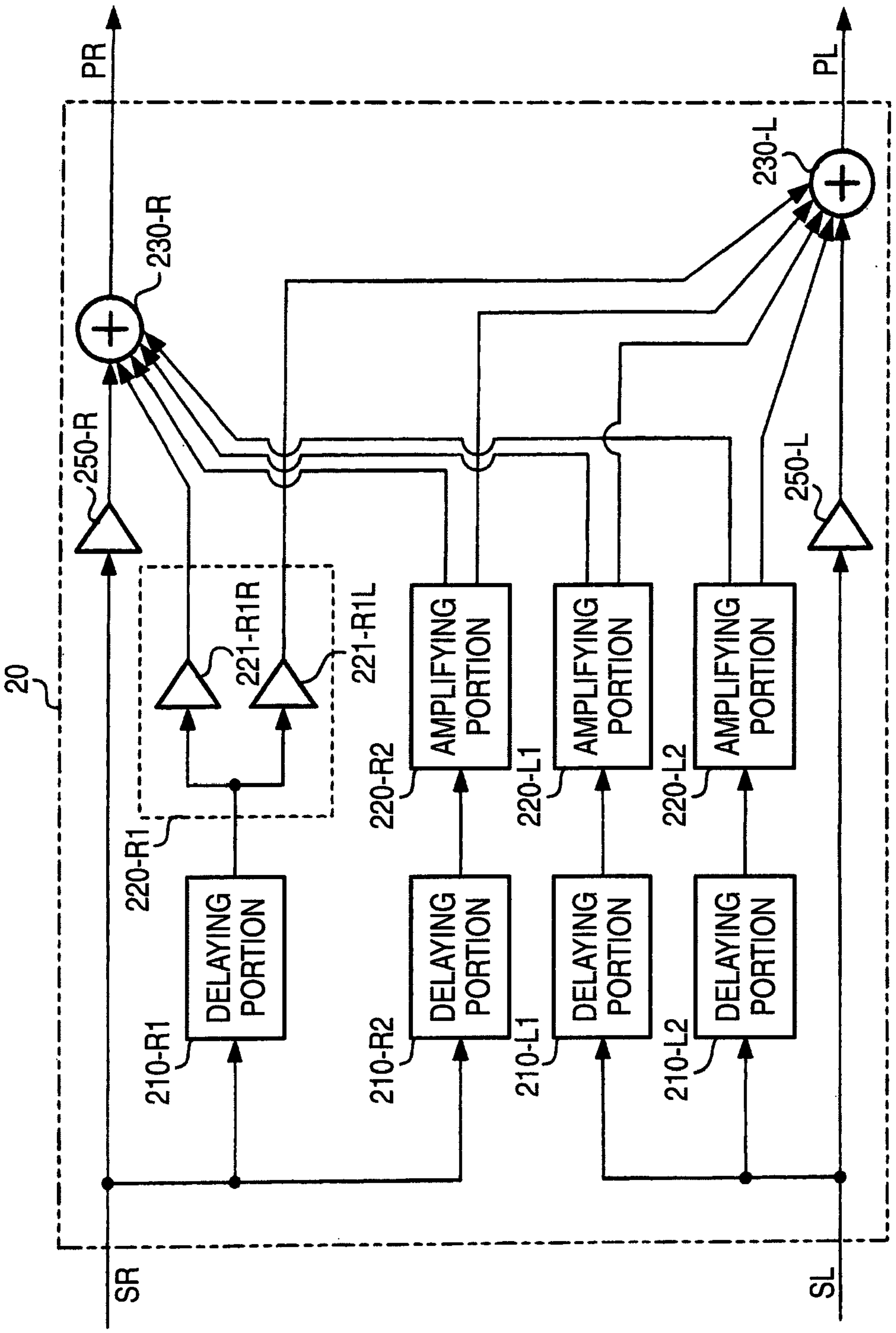
FIG. 2 is a block diagram showing a configuration of an initial reflected sound generating portion according to the embodiment.

The initial reflected sound generating portion 20 generates a right channel audio signal PR and a left channel audio signal PL by attaching an initial reflected sound to the input audio signals SR, SL, and outputs these audio signals PR, PL. Details of a configuration of the initial reflected sound generating portion 20 will be explained with reference to FIG. 2 hereunder.

The initial reflected sound generating portion 20 has taps that consist of a delaying portion 210 and a amplifying portion 220 respectively. Each tap receives the audio signal SR or the audio signal SL and outputs the right-channel audio signal and the left-channel audio signal. The right-channel audio signal being output from each tap and the audio signal SR being amplified in an amplifying portion 250-R at a predetermined amplification factor are added in an adding portion 230-R, and then an audio signal PR is output. In contrast, the left-channel audio signal being output from each tap and the audio signal SL being amplified in an amplifying portion 250-L at a predetermined amplification factor are added in an adding portion 230-L, and then an audio signal PL is output.

A delaying portion 210-R1 applies a delay process to the input audio signal SR to give a predetermined delay time. Then, the audio signal delayed in the delaying portion 210-R1 is amplified in an amplifier circuit 221-R1R and an amplifier circuit 221-R1L of an amplifying portion 220-R1 at a predetermined amplification factor respectively. Here, the audio signal amplified in the amplifier circuit 221-R1R is output to the adding portion 230-R as the right-channel audio signal. In contrast, the audio signal amplified in the amplifier circuit 221-R1L is output to the adding portion 230-L as the left-channel audio signal.

Figure 3:
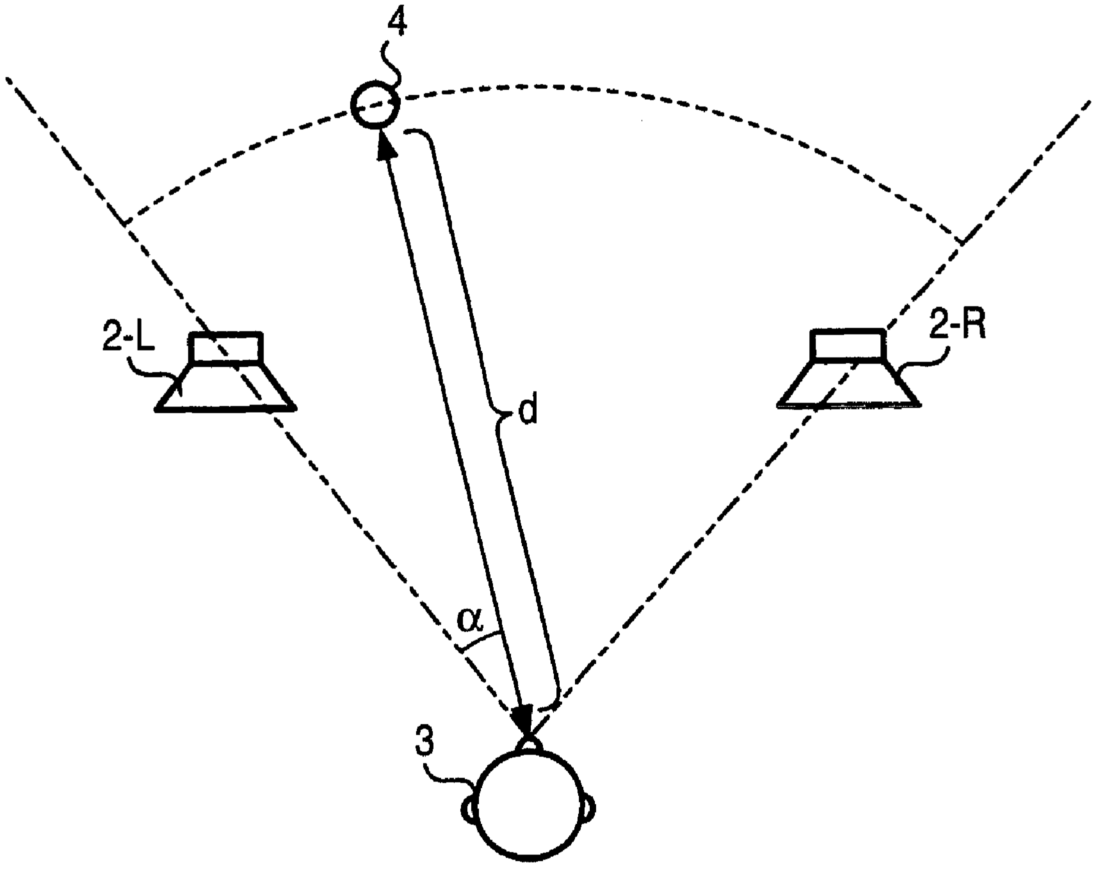
FIG. 3 is an explanatory view showing a sound image of an initial reflected sound according to the embodiment.

Then, a sound image produced when the right-channel audio signal being output from the amplifying portion 220-R1 is emitted from the speaker 2-R and the left-channel audio signal being output from the amplifying portion 220-L1 is emitted from the speaker 2-L in this manner will be explained with reference to FIG. 3 hereunder. FIG. 3 is an explanatory view showing a sound image produced by sounds emitted from the speakers 2-L, 2-R provided on the left and right sides in the front direction of a listener 3 respectively.

The listener 3 catches the emitted sounds as if the audio signal SR is emitted from a sound image 4. A distance d from the listener 3 to the sound image 4 changes in response to the delay time set in the delaying portion 210-R1, and this distance d becomes longer as a delay time is set longer. Also, a direction a of the sound image 4 changes according to a ratio of an amplification factor A set to the amplifier circuit 221-R1R and an amplification factor B set to the amplifier circuit 221-R1L. In the case of the amplification factor A: the amplification factor B=1:1, the sound image 4 positions in the front direction of the listener 3. Then, the sound image 4 moves rightward when viewed from the listener 3, i.e., toward the speaker 2-R side when a rate of the amplification factor A is increased, and moves leftward when viewed from the listener 3, i.e., toward the speaker 2-L side when a rate of the amplification factor A is increased.

Here, the initial reflected sound generating portion 20 is provided to reproduce the initial reflected sound. It is desirable that a delay time set in the delaying portion 210-R1 should be set to 60 millisecond or less such that the sound in which the sound image produced by the sounds emitted based on the audio signals SR, SL that are not processed in the delaying portion 210 and the amplifying portion 220 and that the sound image produced by the sounds emitted based on the audio signals that are processed in the delaying portion 210-R1 and the amplifying portion 220-R1 are not separated and which has a sense of togetherness should be produced. Since the sound image obtained by the process in the initial reflected sound generating portion 20 has a sense of togetherness, the glossy sound having a real depth can be obtained.

Returning to FIG. 2, explanation will be continued further. A delaying portion 210-R2 and an amplifying portion 220-R2 are similar to the delaying portion 210-R1 and the amplifying portion 220-R1 mentioned above, and thus their explanation will be omitted herein. In this manner, in the present embodiment, there are two taps into which the audio signal SR is input. That is, two sound images that emit the audio signal SR are present. Normally a delay time set in the delaying portion 210-R1 and a delay time set in the delaying portion 210-R2 are set differently such that two sound images do not overlap with each other. Also, a ratio between an amplification factor set in the amplifier circuit 221-R1R of the amplifying portion 220-R1 and an amplification factor set in the amplifier circuit 221-R1L and a ratio between an amplification factor set in the amplifier circuit 221-R2R of the amplifying portion 220-R2 and an amplification factor set in the amplifier circuit 221-R2L are set to a different ratio respectively, so that the sound image is located.

Also, a tap of a delaying portion 210-L1 and an amplifying portion 220-L1 and a tap of a delaying portion 210-L2 and an amplifying portion 220-L2 are constructed similarly to those in the delaying portion 210-R1 and the amplifying portion 220-R1 except the input audio signal is the audio signal SL, and therefore their explanation will be omitted herein. In this manner, the initial reflected sound generating portion 20 adds the audio signals being output from respective taps and the amplifying portions 250-R, 250-L to the adding portions 230-R, 230-L respectively, and outputs the audio signals PR, PL.

When the audio signals PR, PL are emitted from the speakers 2-R, 2-L respectively, the sound image corresponding to the audio signal SR and the sound image corresponding to the audio signal SL are obtained in addition to the sound images obtained by the normal audio signals SR, SL respectively, i.e., four sound images in total can be obtained. Here, in the present embodiment, four images are obtained by using four taps in total, but at least one tap may be used. For example, only the tap of the delaying portion 210-R1 and the amplifying portion 220-R1 may be used. Conversely, the sound images may be increased by using a larger number of taps. With above, explanation of the initial reflected sound generating portion 20 is completed.

Figure 4:
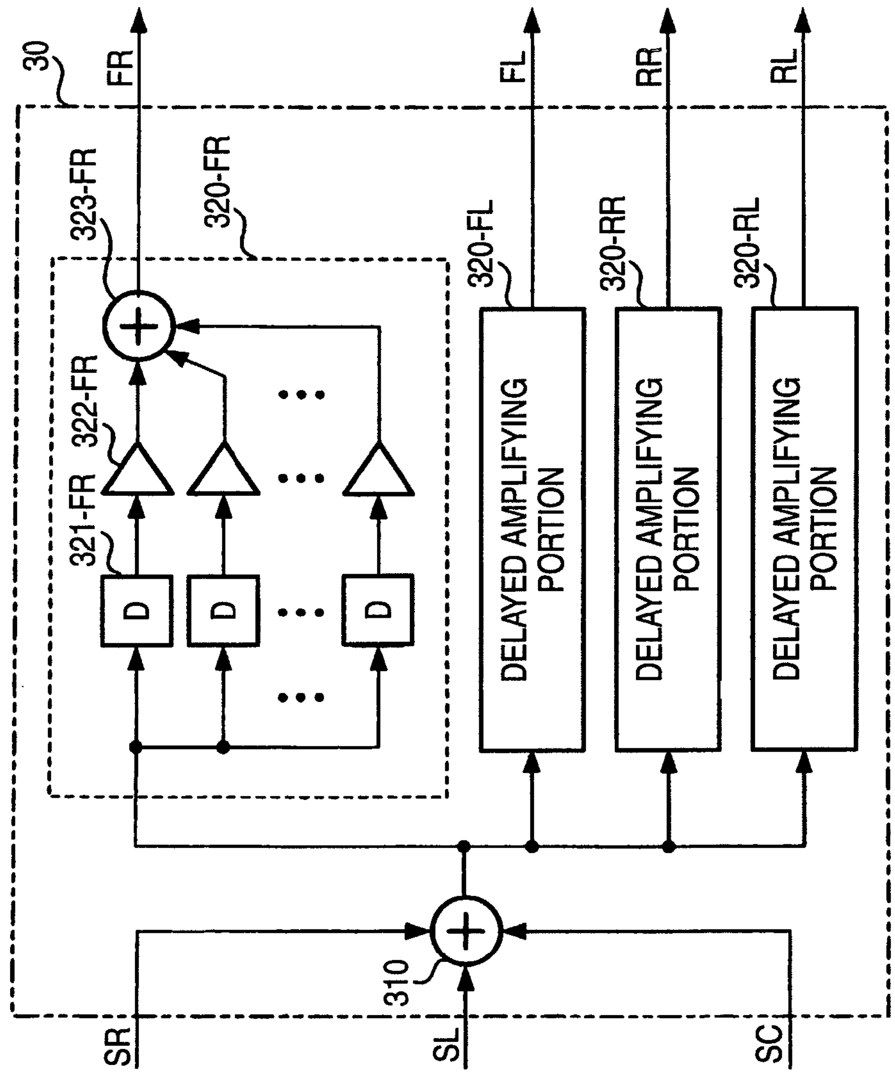
FIG. 4 is a block diagram showing a configuration of a space reflected sound generating portion according to the embodiment.

Returning to FIG. 1, explanation will be continued. The space reflected sound generating portion 30 attaches a space reflected sound to the audio signal that is synthesized by adding the input audio signals SR, SL, SC, Thus, the space reflected sound generating portion 30 generates a front right-channel audio signal FR, a front left-channel audio signal FL, a rear right-channel audio signal RR (third audio signal), and a rear left-channel audio signal RL (fourth audio signal), and outputs these audio signals. A detailed configuration of the space reflected sound generating portion 30 will be explained with reference to FIG. 4 hereunder.

An adding portion 310 receives the audio signals SR, SL, SC, and then outputs an audio signal synthesized by adding these signals (referred to as a "synthesized audio signal" hereinafter) to delayed amplifying portions 320-FR, 320-FL, 320-RR, 320-RL.

The delayed amplifying portion 320-FR has a plurality of taps each consisting of a delay circuit 321-FR and an amplifier circuit 322-FR. Each tap receives the synthesized audio signal, and then the audio signals output from respective taps are added in an adding portion 323-FR and an added signal is output as the audio signal FR. In this case, there is no necessity that a plurality of taps should always be provided, and only one tap or more may be provided.

The delay circuits 321-FR apply a delay process to the input synthesized audio signal to give a predetermined delay time respectively. Then, the amplifier circuits 322-FR amplify the synthesized audio signal delayed in the delay circuits 321-FR at a predetermined amplification factor respectively, and output the amplified signals to the adding portion 323-FR respectively. Then, the adding portion 323-

FR adds the synthesized audio signals being output from respective taps in the delayed amplifying portion 320-FR, and outputs the audio signal FR.

Other delayed amplifying portions 320-FL, 320-RR, 320-RL have the similar configuration to the delayed amplifying portions 320-FR respectively except that the output audio signals are the audio signals FL, RR, RL, and their explanation will be omitted herein. Assume that the speaker is provided on the front right side, the front left side, the rear right side, and the rear left side of the listener respectively and then the audio signals FR, FL, RR, RL generated in this manner are emitted from respective speakers, the listener can feel the sounds as the space reflected sounds from various directions. Here, the reflected sound from the front side of the listener is reproduced by the sounds emitted based on the audio signal FR, FL, the reflected sound from the rear side of the listener is reproduced by the sounds emitted based on the audio signal RR, RL, the reflected sound from the left side of the listener is reproduced by the sounds emitted based on the audio signal FL, RL, and the reflected sound from the right side of the listener is reproduced by the sounds emitted based on the audio signal FR, RR. In this case, the delay times set in the delay circuits 321 of the space reflected sound generating portion 30 may be set longer than the delay times set in the delay portions 210 of the initial reflected sound generating portion 20 respectively such that the space reflected sounds reproduced in the space reflected sound generating portion 30 do not overlap with the initial reflected sounds reproduced in the initial reflected sound generating portion 20.

Figure 5:
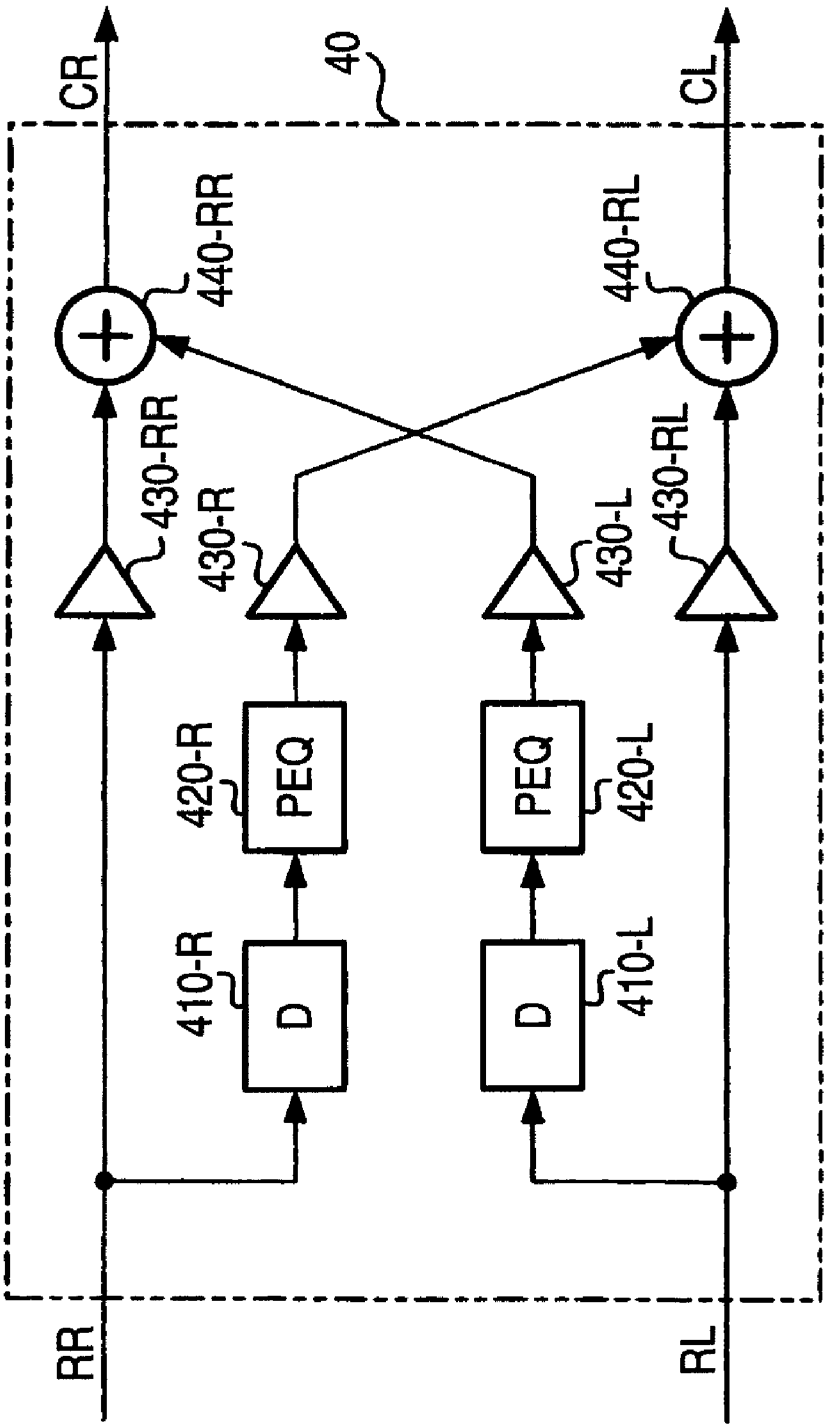
FIG. 5 is a block diagram showing a configuration of a cross talk canceling portion according to the embodiment.

Returning to FIG. 1, explanation will be still continued. A cross talk canceling portion 40 receives the audio signals RR, RL generated in the space reflected sound generating portion 30, and applies the process of canceling the interaural cross talk to the input audio signals RR, RL. Therefore, the cross talk canceling portion 40 outputs the audio signals CR, CL that can cause the listener to feel a sense of rear from the sounds emitted from the speakers 2-R, 2-L in the front direction of the listener. A detailed configuration of the cross talk canceling portion 40 will be explained with reference to FIG. 5 hereunder.

A delay circuit 410-R receives the audio signal RR and applies a delaying process to this signal to give a predetermined delay time, adjusts the phase to roughly reverse, and outputs a resultant signal to a parametric equalizer 420-R. Then, the parametric equalizer 420-R adjusts the phase of the audio signal RR whose phase is adjusted into the predetermined frequency characteristic, and then an amplifier circuit 430-R amplifies the audio signal at a predetermined amplification factor and outputs the amplified signal to an adding portion 440-RL. In contrast, an amplifier circuit 430-RL amplifies the audio signal RL at a predetermined amplification factor and outputs the amplified signal to the adding portion 440-RL.

The adding portion 440-RL adds the audio signal RR which is output from the amplifier circuit 430-R and whose phase has been adjusted and the audio signal RL which is output from the amplifier circuit 430-RL and which has been subjected to the amplifying process, and outputs the audio signal CL.

In contrast, a delay circuit 410-L receives the audio signal RL and applies the delaying process to this signal to give a predetermined delay time, adjusts the phase to roughly reverse, and outputs a resultant signal to a parametric equalizer 420-L. Then, the parametric equalizer 420-L adjusts the phase of the audio signal RL whose phase is adjusted into the predetermined frequency characteristic, and then an amplifier circuit 430-L amplifies the audio signal at a predetermined amplification factor and outputs the amplified signal to an adding portion 440-RR. Also, an amplifier circuit 430-RR amplifies the audio signal RR at a predetermined amplification factor and outputs the amplified signal to the adding portion 440-RR.

The adding portion 440-RR adds the audio signal RL which is output from the amplifier circuit 430-L and whose phase has been adjusted and the audio signal RR which is output from the amplifier circuit 430-RR and which has been subjected to the amplifying process, and outputs the audio signal CR. In this manner, the audio signal CR is output as the audio signal in which the audio signal RL whose phase has been adjusted is added to the audio signal RR, and the audio signal CL is output as the audio signal in which the audio signal RR whose phase has been adjusted is added to the audio signal RL. Accordingly, even when the audio signal CR and the audio signal CL are emitted from the speaker 2-R and the speaker 2-L provided in front of the listener, the sound having a sense of rear can be emitted because the cross talk is canceled. With the above, explanation of the configuration of the cross talk canceling portion 40 is completed.

Returning to FIG. 1, explanation will be still continued. An adding portion 50-R receives the audio signal PR being output from the initial reflected sound generating portion 20, the audio signal FR being output from the space reflected sound generating portion 30, and the audio signal CR being output from the cross talk canceling portion 40, then adds these audio signals, and then supplies the added signal to the speaker 2-R. Then, the sound is emitted from the speaker 2-R.

In contrast, an adding portion 50-L receives the audio signal PL being output from the initial reflected sound generating portion 20, the audio signal FL being output from the space reflected sound generating portion 30, and the audio signal CL being output from the cross talk canceling portion 40, then adds these audio signals, and then supplies the added signal to the speaker 2-L. Then, the sound is emitted from the speaker 2-L.

In this manner, the acoustic processing device 1 according to the embodiment of the present invention receives the audio signals as the stereo signals, and can generate the space reflected sound from the audio signal as the monaural signal that is synthesized from the right-channel and the left-channel audio signals, and can generate the initial reflected sound from the audio signals as the stereo signals. In this manner, because the initial reflected sound is generated from the audio signals as the stereo signals, an emphasizing effect can be attached to a sound source while keeping a stereo feeling. As a result, the sound image can be emphasized, and the glossy sound having a real depth can be obtained in contrast to the case where the initial reflected sound is generated from the audio signals as the monaural signal.

With the above, the embodiment of the present invention is explained. But the present invention can be carried out in various modes as described hereunder.

<Variation 1>

In the above embodiment, the delay time and the amplification factor are set previously in the delaying portions 210 and the amplifying portions 220 in respective taps of the initial reflected sound generating portion 20 respectively. But the setting of the delay times and the amplification factors may be changed. In this case, as indicated with a broken line in FIG. 1, a storing portion 60 in which a plurality of tables that correlate the delay times and the amplification factors (amplification factors corresponding to two amplification circuits) being set in the delaying portions 210 and the amplifying portions 220 in respective taps with the taps respectively are stored in response to the acoustic processing conditions may be provided. At this time, the amplification factors being set in the amplifying portion 250-R, 250-L may be stored on the storing portion 60 while correlating with the acoustic processing conditions. Then, when the acoustic processing conditions are to be decided by operating an operating portion (not shown), a controlling portion (not shown) may read the table of the acoustic processing conditions from the storing portion 60 and may set the delay times and the amplification factors corresponding to the delaying portions 210 and the amplifying portions 220. Here, various numbers of taps indicated by the table can be set, and the number of taps in the initial reflected sound generating portion 20 may be increased/decreased in response to the numbers. With this arrangement, the effect of the initial reflected sound can be changed in various modes by operating the operating portion.

In this event, not only the table used in the initial reflected sound generating portion 20 but also the table used in the space reflected sound generating portion 30 may be stored in the storing portion 60. Also, the delay times and the amplification factors may be set similarly. Also, the parameters in the cross talk canceling portion 40 may be stored in advance in the storing portion 60 every acoustic processing conditions, and then may be set by the controlling portion.

<Variation 2>

Figure 6:
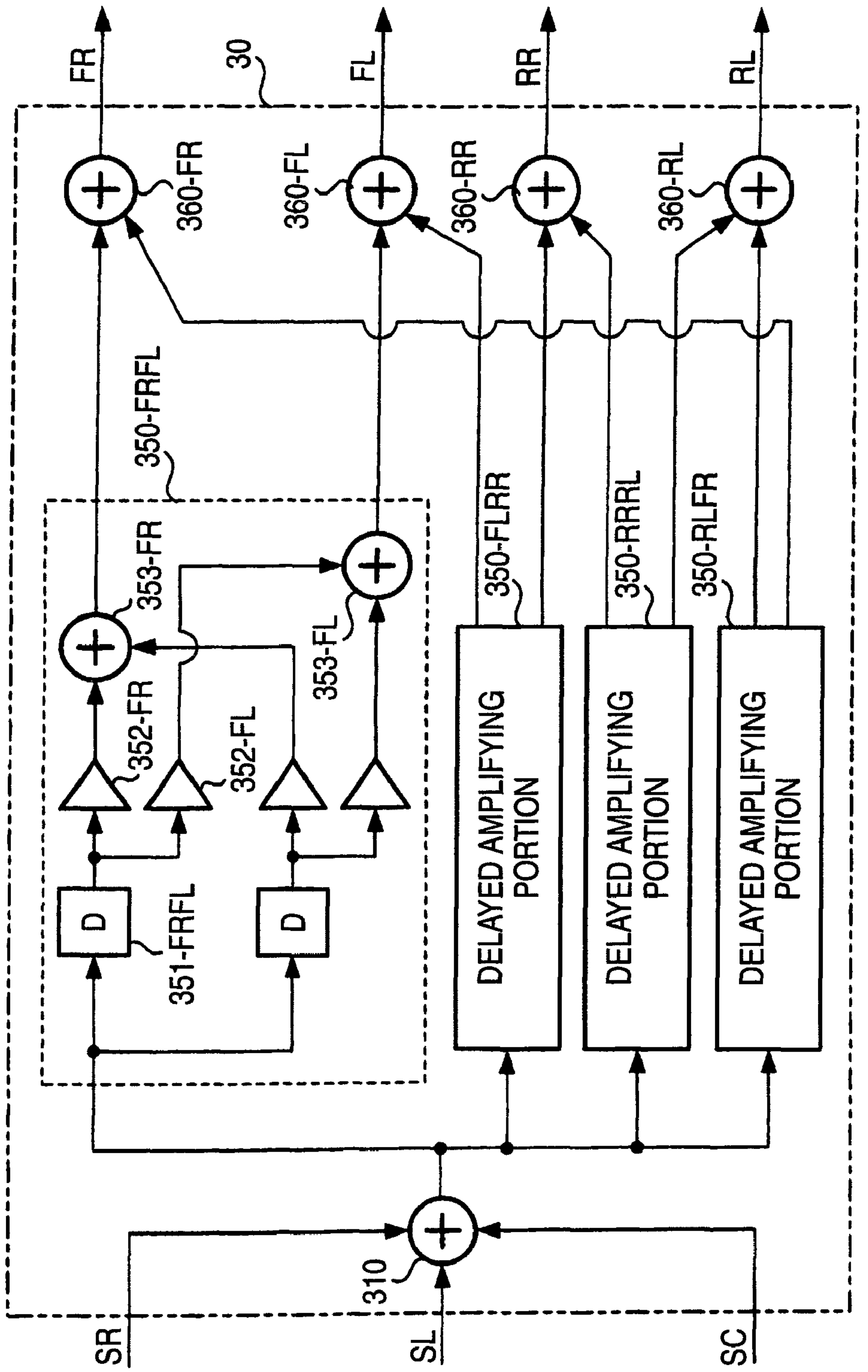
FIG. 6 is a block diagram showing a configuration of a space reflected sound generating portion according to a variation 2 of the embodiment.

In the above embodiment, the delayed amplifying portions 320 in the space reflected sound generating portion 30 are provided every output audio signal, and the synthesized audio signal is delayed by a plurality of taps in the delayed amplifying portions 320 and the outputs from respective taps are synthesized. The space reflected sound generating portion 30 may be constructed such that respective taps correspond to respective sound images, like the process in the initial reflected sound generating portion 20. In this case, the space reflected sound generating portion 30 may be constructed as shown in FIG. 6. The configuration will be explained hereunder.

A delayed amplifying portion 350-FRFL receives the synthesized audio signal being output from the adding portion 310, and outputs the audio signal FR and the audio signal FL. The tap is constructed by a delay circuit 351-FRFL, and amplifier circuits 352-FR, 352-FL. In the present variation, the delayed amplifying portion 350-FRFL has two taps. The configuration of each tap is similar to the tap in the initial reflected sound generating portion 20 in the above embodiment except the input audio signal is the synthesized audio signal and the input audio signals are the audio signals FR, FL. Therefore, their explanation will be omitted herein.

Then, the audio signals FR output from respective taps are added by an adding portion 353-FR, and then the added signal is output to an adding portion 360-FR. In contrast, the audio signals FL output from respective taps are added by an adding portion 353-FL, and then the added signal is output to an adding portion 360-FL. Accordingly, the delayed amplifying portion 350-FRFL generates the audio signals FR, FL that produce the sound image in the front direction of the listener, i.e., the direction between the speaker 2-R and the speaker 2-L.

Similarly, a delayed amplifying portion 350-FLRR receives the synthesized audio signal output from the adding portion 310, and outputs the audio signal FL and the audio signal RR to adding portions 360-FL, 360-RR respectively. Accordingly, the delayed amplifying portion 350-FLRR generates the audio signals FL, RR that produce the sound image on the left side of the listener. Also, a delayed amplifying portion 350-RRRL receives the synthesized audio signal output from the adding portion 310, and outputs the audio signal RR and the audio signal RL to adding portions 360-RR, 360-RL respectively. Accordingly, the delayed amplifying portion 350-RRRL generates the audio signals RR, RL that produce the sound image on the rear side of the listener. Then, a delayed amplifying portion 350-RLFR receives the synthesized audio signal output from the adding portion 310, and outputs the audio signal RL and the audio signal FR to the adding portions 360-RL, 360-FR. Accordingly, the delayed amplifying portion 350-RLFR generates the audio signals RL, FR that produce the sound image on the right side of the listener.

Then, the adding portion 360-FR adds the input audio signals FR and outputs the added signal. Similarly, the adding portions 360-FL, 360-RR, 360-RL add the input audio signals FL, RR, RL respectively, and outputs the added signal respectively. In this manner, as the configuration using the taps every one sound image, the space reflected sound may be attached to the audio signals.

Variation 3>

Figure 7:
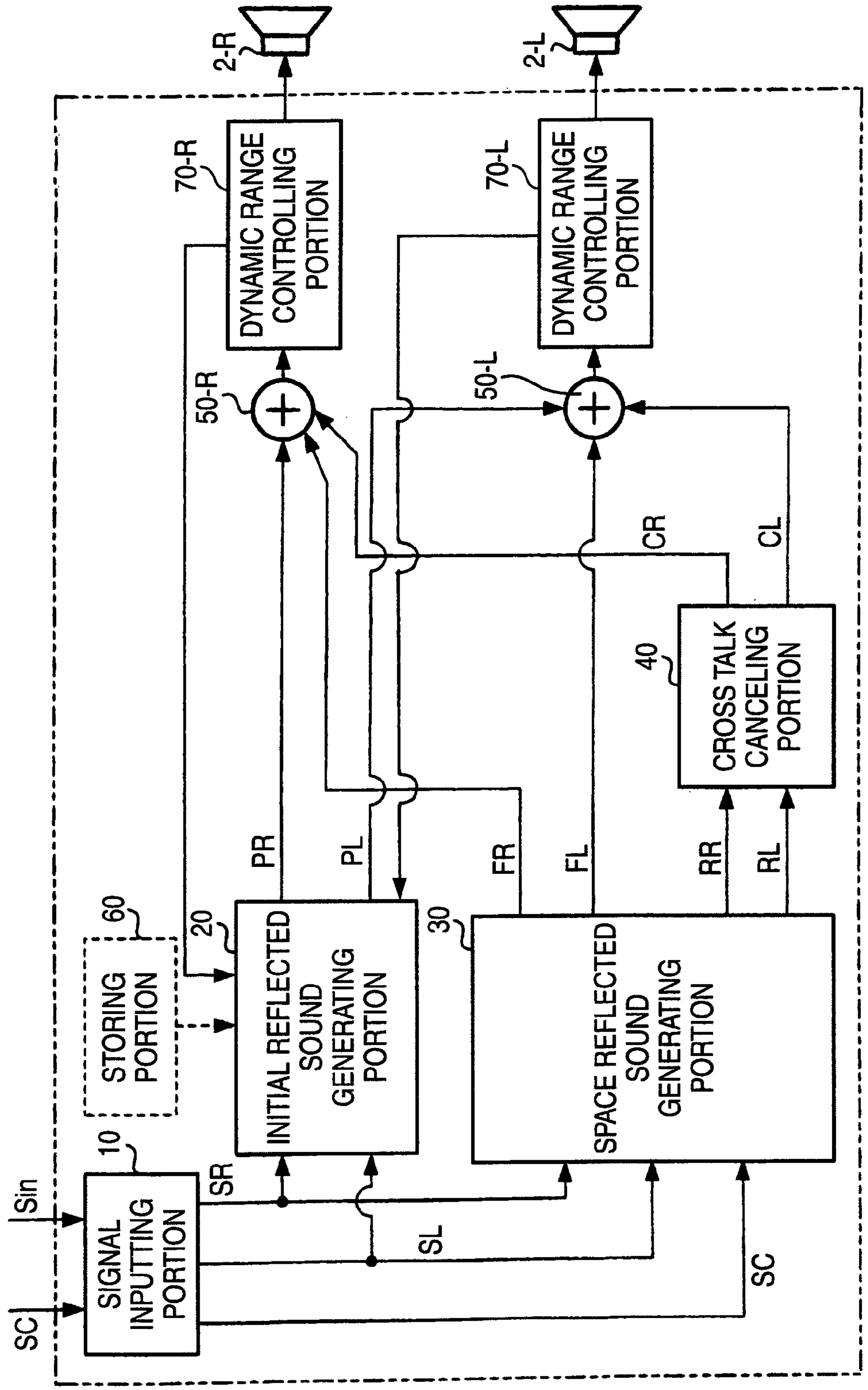
FIG. 7 is a block diagram showing a configuration of dynamic range controlling portions according to a variation 3 of the embodiment.

In the above embodiment, dynamic range controlling portions 70-R,70-L may be provided between the adding portion 50-R and the speaker 2-R and between the adding portion 50-L and the speaker 2-L respectively as shown in FIG. 7. The dynamic range controlling portions 70-R, 70-L receive the audio signals being output from the adding portions 50-R, 50-L, then adjusts the amplitudes such that the dynamic ranges of respective audio signals are corrected, and then supplies the signals to the speakers 2-R, 2-L. In this case, when a ratio between the amplification factors set in the amplifying portion 220 in the initial reflected sound generating portion 20 or the amplification factors set in two the amplifier circuits 221 of the amplifying portion 220 is substantially changed by adjusting the amplitudes and thus the location of the sound image is changed, the amplification factors set in respective the amplifier circuits 221 may be corrected in response to a correction mode of the dynamic range. For example, when the correction of the dynamic ranges causes the compression of the dynamic range, sometimes a ratio of the amplification factors set in two amplifier circuits 221 of the amplifying portion 220 is reduced substantially and thus the location of the sound image is changed. In such case, a correction is made to increase a ratio of the amplification factors set in two amplifier circuits 221 such that a desired ratio of the amplification factors can be obtained after the correction of the dynamic range.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No, 2007-310764 filed on Nov. 30, 2007, the contents of which are incorporated herein for reference.

What is claimed is:

1. An acoustic processing device, comprising:

an inputting section which receives a first audio signal and a second audio signal;

a first input signal amplifying section which amplifies the first audio signal at a predetermined amplification factor;

a second input signal amplifying section which amplifies the second audio signal at a predetermined amplification factor;

a first initial delayed amplifying section having:

a delay portion for delaying the first audio signal to give a predetermined delay time;

a first amplifying portion for amplifying the delayed first audio signal at a first amplification factor; and a second amplifying portion for amplifying the delayed first audio signal at a second amplification factor;

a first adding section which adds the first audio signal amplified by the first amplifying portion and the first audio signal amplified by the first input signal amplifying section;

a second adding section which adds the first audio signal amplified by the second amplifying portion and the second audio signal amplified by the second input signal amplifying section;

a first supplying section which supplies an audio signal output from the first adding section to a first sound emitting section;

a second supplying section which supplies an audio signal output from the second adding section to a second sound emitting section being different from the first sound emitting section;

a synthesizing section which adds the first audio signal and the second audio signal to output an added signal as a synthesized audio signal; and a space reflected sound generating section including:

a first space delayed amplifying section which has a delay portion for delaying the synthesized audio signal output from the synthesizing section to give a predetermined delay time and an amplifying portion for amplifying the delayed synthesized audio signal at a predetermined amplification factor to output a first amplified signal to the first supplying section; and a second space delayed amplifying section which has a delay portion for delaying the synthesized audio signal output from the synthesizing section to give a predetermined delay time and an amplifying portion for amplifying the delayed synthesized audio signal at a predetermined amplification factor to output a second amplified signal to the second supplying section.

2. The acoustic processing device according to claim 1, wherein a plurality of the first initial delayed amplifying sections are provided; and wherein the predetermined delay times given by a plurality of the delay portions of the first initial delayed amplifying sections are different to each other.

3. The acoustic processing device according to claim 1, wherein a plurality of the first initial delayed amplifying sections are provided; and wherein a first ratio between the first amplification factor of the first amplifying portion and the second amplification factor of the second amplifying portion of a first section of the plurality of first initial delayed amplifying sections is different from a second ratio between the first amplification factor of the first amplifying portion and the second amplification factor of the second amplifying portion of a second section of the plurality of first initial delayed amplifying sections.

4. The acoustic processing device according to claim 1, further includes a second initial delayed amplifying section having:

a delay portion for delaying the second audio signal being input from the inputting section to give a predetermined delay time;

a first amplifying portion for amplifying the delayed second audio signal at a first amplification factor; and a second amplifying portion for amplifying the delayed second audio signal at a second amplification factor;

wherein the first adding section adds the first audio signal amplified by the first amplifying portion of the first initial delayed amplifying section, the first audio signal amplified by the first input signal amplifying section, and the second audio signal amplified by the first amplifying portion of the second initial delayed amplifying section; and wherein the second adding section adds the first audio signal amplified by the second amplified portion of the first initial delayed amplifying section, the second audio signal amplified by the second input signal amplifying section, and the second audio signal amplified by the second amplifying portion of the second initial delayed amplifying section.

5. The acoustic processing device according to claim 4, wherein the delay times set in the first initial delayed amplifying section and the second initial delayed amplifying section are 60 millisecond or less respectively.

6. The acoustic processing device according to claim 1, wherein the delay times set in the first space delayed amplifying section and the second space delayed amplifying section are longer than the delay time set in the first initial delayed amplifying section.

7. The acoustic processing device according to claim 1, further comprising: a cross talk canceling section which includes:

a first phase adjusting portion which adjusts a phase of a third audio signal;

a second phase adjusting portion which adjusts a phase of a fourth audio signal;

a first adding portion which adds the adjusted fourth audio signal and the third audio signal to output a first added signal to the first supplying section; and a second adding portion which adds the adjusted third audio signal and the fourth audio signal to output a second added signal to the second supplying section, wherein the space reflected sound generating section further includes:

a third space delayed amplifying section which has a delay portion for delaying the synthesized audio signal output from the synthesizing section to give a predetermined delay time and an amplifying portion for amplifying the delayed synthesized audio signal at a predetermined amplification factor to output the third amplified signal; and a fourth space delayed amplifying section which has a delay portion for delaying the synthesized audio signal output from the synthesizing section to give a predetermined delay time and an amplifying portion for amplifying the delayed synthesized audio signal at a predetermined amplification factor to output the fourth amplified signal.

8. The acoustic processing device according to claim 1, further comprising:

a second inputting section which receives a monaural audio signal, wherein the synthesizing section further adds the monaural audio signal to the first audio signal and the second audio signal to output the added signal.

9. The acoustic processing device according to claim 1, further comprising:

a dynamic range controlling section which receives the audio signal that is added in the first supplying section and the audio signal that is added in the second supplying section to corrects dynamic ranges of respective input audio signals, wherein the dynamic range controlling section supplies the corrected audio signals to the first and second sound emitting sections.

10. The acoustic processing device according to claim 9, further comprising:

a correcting section which corrects the first amplification factor and the second amplification factor set in the first initial delayed amplifying section, based on a correction of the dynamic range by the dynamic range controlling section.

11. An acoustic processing method, comprising:

receiving a first audio signal and a second audio signal; amplifying the first audio signal at a predetermined amplification factor;

amplifying the second audio signal at a predetermined amplification factor;

delaying the first audio signal to give a predetermined delay time;

amplifying the delayed first audio signal at a first amplification factor;

amplifying the delayed first audio signal at a second amplification factor;

adding the first audio signal amplified by the first amplification factor and the first audio signal amplified by the predetermined amplification factor to output a third audio signal;

adding the first audio signal amplified by the second amplification factor and the second audio signal amplified by the predetermined amplification factor to output a fourth audio signal;

adding the first audio signal and the second audio signal to output an added signal as a synthesized audio signal;

delaying the synthesized audio signal to give a first delay time;

amplifying the delayed synthesized audio signal at a predetermined amplification factor to output a first amplified signal;

delaying the synthesized audio signal to give a second delay time;

amplifying the delayed synthesized audio signal at a predetermined amplification factor to output a second amplified signal;

adding the third audio signal and the first amplified signal to output a fifth audio signal;

adding the fourth audio signal and the second amplified signal to output a sixth audio signal;

supplying the fifth audio signal to a first sound emitting section; and supplying the sixth audio signal to a second sound emitting section which is different from the first sound emitting section.

* * * * *